United States Patent
Lu et al.

(10) Patent No.: US 8,405,199 B2
(45) Date of Patent: Mar. 26, 2013

(54) CONDUCTIVE PILLAR FOR SEMICONDUCTOR SUBSTRATE AND METHOD OF MANUFACTURE

(75) Inventors: Wen-Hsiung Lu, Jhonghe (TW); Ming-Da Cheng, Jhubei (TW); Chih-Wei Lin, Xinfeng Township (TW); Ming-Che Ho, Tainan (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 58 days.

(21) Appl. No.: 12/832,231

(22) Filed: Jul. 8, 2010

(65) Prior Publication Data

US 2012/0007228 A1 Jan. 12, 2012

(51) Int. Cl.
*H01L 23/48* (2006.01)

(52) U.S. Cl. .................... 257/692; 438/613

(58) Field of Classification Search ........... 257/E23.021, 257/E21.508, 673, 737
See application file for complete search history.

(56) References Cited

U.S. PATENT DOCUMENTS

| | | | |
|---|---|---|---|
| 6,413,851 B1 | 7/2002 | Chow et al. | |
| 6,455,408 B1 * | 9/2002 | Hwang et al. | 438/613 |
| 6,847,110 B2 * | 1/2005 | Akram et al. | 257/706 |
| 6,960,828 B2 * | 11/2005 | Nair et al. | 257/734 |
| 7,095,116 B1 * | 8/2006 | Kelkar et al. | 257/737 |
| 7,271,483 B2 * | 9/2007 | Lin et al. | 257/737 |
| 2003/0151129 A1 * | 8/2003 | Akram et al. | 257/707 |
| 2004/0053483 A1 * | 3/2004 | Nair et al. | 438/540 |
| 2004/0212102 A1 * | 10/2004 | Akram et al. | 257/781 |
| 2006/0087034 A1 | 4/2006 | Huang et al. | |
| 2006/0252225 A1 * | 11/2006 | Gambee et al. | 438/400 |
| 2008/0023851 A1 * | 1/2008 | Andry et al. | 257/779 |
| 2011/0049706 A1 * | 3/2011 | Huang et al. | 257/737 |
| 2011/0062580 A1 * | 3/2011 | Liu et al. | 257/737 |
| 2011/0254159 A1 * | 10/2011 | Hwang et al. | 257/738 |
| 2011/0260317 A1 * | 10/2011 | Lu et al. | 257/737 |
| 2011/0278716 A1 * | 11/2011 | Hsu et al. | 257/737 |
| 2011/0298123 A1 * | 12/2011 | Hwang et al. | 257/737 |
| 2012/0007230 A1 * | 1/2012 | Hwang et al. | 257/737 |

FOREIGN PATENT DOCUMENTS

CN 1841689 10/2006

OTHER PUBLICATIONS

OA dated Dec. 5, 2012 from corresponding application No. CN201010597704.3.

* cited by examiner

*Primary Examiner* — Thao P. Le
(74) *Attorney, Agent, or Firm* — Lowe Hauptman Ham & Berner, LLP

(57) ABSTRACT

An embodiment of the disclosure includes a conductive pillar on a semiconductor die. A substrate is provided. A bond pad is over the substrate. A conductive pillar is over the bond pad. The conductive pillar has a top surface, edge sidewalls and a height. A cap layer is over the top surface of the conductive pillar. The cap layer extends along the edge sidewalls of the conductive pillar for a length. A solder material is over a top surface of the cap layer.

20 Claims, 8 Drawing Sheets

US 8,405,199 B2

CONDUCTIVE PILLAR FOR SEMICONDUCTOR SUBSTRATE AND METHOD OF MANUFACTURE

TECHNICAL FIELD

The disclosure relates generally to semiconductor packaging processes, and more particularly to a structure and methods of forming a conductive pillar in a flip chip package.

BACKGROUND

Flip chip technology plays an important role in the packaging of semiconductor devices. A flip chip microelectronic assembly includes a direct electrical connection between face down electronic components and substrates, such as circuit boards, using solder bumps as the interconnects. The use of flip chip packaging has dramatically grown as a result of the advantages in size, performance and flexibility flip chips have over other packaging methods.

Recently, copper pillar technology has been developed. Instead of using solder bumps, electronic components are connected to substrates by means of a copper pillar. The copper pillar technology achieves finer pitches with minimum probability of bump bridging, reduces the capacitance load of the circuits and allows the electronic components to perform at higher frequencies.

However, stress may cause cracks along the interface of the copper pillar and the solder used to bond the electronic component. The cracks may cause serious reliability concerns due to high leakage currents. The stress may also lead to underfill cracking along the interface of the underfill and the copper pillar. The cracks may propagate to the underlying low dielectric constant (low-K) dielectric layers of the substrate.

Accordingly, there is a need for an improved structure and method to form conductive pillar for a semiconductor wafer with robust electrical performance.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

FIGS. 1 to 8 are cross-sectional views showing various stages during fabrication of a structure according to one or more embodiments of this invention. The term "substrate" as described herein, refers to a semiconductor substrate on which various layers and integrated circuit components are formed. The substrate may include silicon or a compound semiconductor, such as GaAs, InP, Si/Ge, or SiC. Examples of layers may include dielectric layers, doped layers, metal layers, polysilicon layers and/or via plugs that may connect one layer to one or more layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The plurality of semiconductor dies are divided by scribe lines (not shown) between the dies. The following process steps will be performed on one or more of semiconductor dies on the surface of the substrate.

Figure 1:
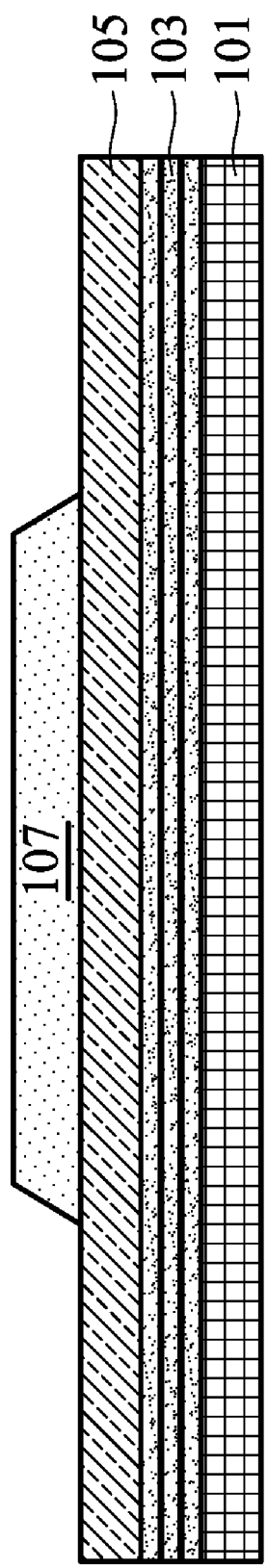
FIGS. 1 to 8 are cross-sectional views showing various stages during fabrication of a structure according to one or more embodiments.

Referring to FIG. 1, a portion of a substrate 101 with a plurality of semiconductor dies on the surface is provided. The portion of the substrate 101 in FIG. 1 contains only a portion of one of the plurality of dies. A plurality of interconnect layers 103 are formed on the surface of the substrate 101. The interconnect layers 103 include one or more conductive layers disposed within one or more dielectric layers. The conductive layers electrically connect integrated circuit components, and provide electrical connections from the integrated circuits to the upper layers. The dielectric layer in the interconnect layers 103 may comprise, for example, low-k dielectric materials with dielectric constants (k value) between about 2.9 and 3.8, ultra low-k (ULK) dielectric materials with k values between about 2.5 and about 2.9, some combinations of low-k dielectric materials, or the like. Typically the lower k value a dielectric layer has, the more fragile and prone to delamination and cracking the layer becomes.

A first passivation layer 105 is formed over the interconnect layers 103 to protect the integrated circuits and interconnect layers 103 from damage and contamination. In some embodiments, the first passivation layer 105 may comprise one or more layers, and typically includes a material such as undoped silicate glass (USG), silicon nitride (SiN), silicon dioxide ($SiO_2$) or silicon oxynitride (SiON). The first passivation layer 105 prevents or decreases moisture, mechanical, and radiation damage to the integrated circuits.

Still referring to FIG. 1, a bond pad 107 is formed over the first passivation layer 105. The bond pad 107 electrically contacts a conductive layer in the interconnect layers 103 and provides electrical connection to the underlying integrated circuits. In one embodiment, the bond pad 107 may include an electrically conductive material such as aluminum, aluminum alloy, copper, copper alloy, or combinations thereof. The bond pad 107 can be deposited by physical vapor deposition (PVD) such as a sputtering deposition using a sputtering target made of aluminum, copper or an alloy thereof followed by patterning the deposited layer for the bond pad 107 with photolithography and etching.

Figure 2:
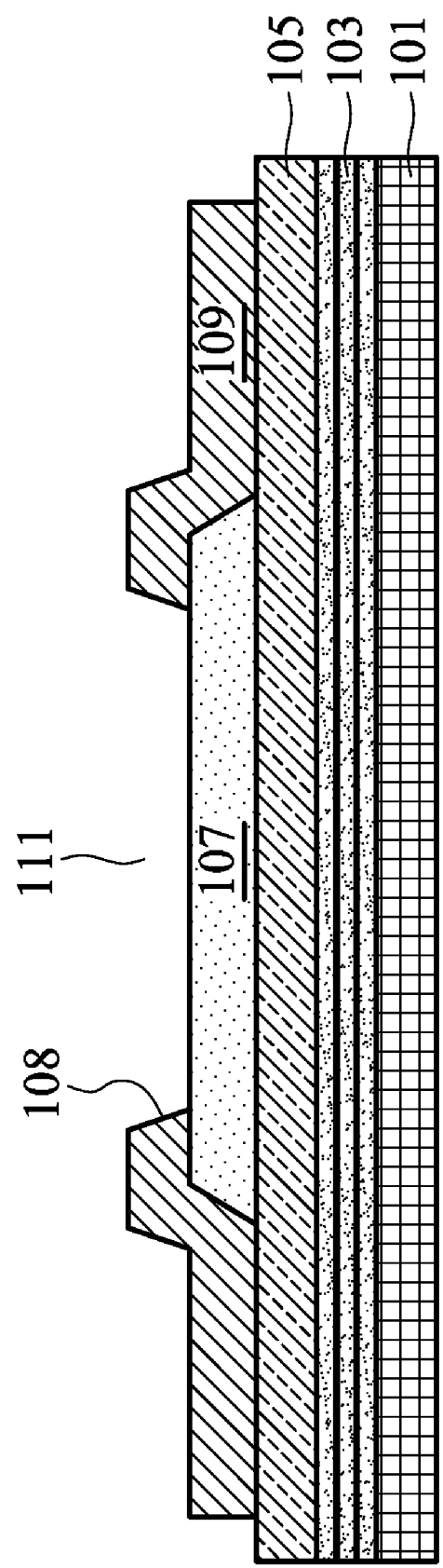

Referring to FIG. 2, a second passivation layer 109 is formed over the first passivation layer 105 and the bond pad 107. In some embodiments, the second passivation layer 109 may have one or more layers of the same set of materials previously listed for the first passivation layer 105. The first passivation layer 105 and second passivation layer 109 may have the same material or different materials. The second passivation layer 109 may be deposited over the first passivation layer 105 and the bond pad 107 by applicable deposition techniques, such as chemical vapor deposition (CVD). Photolithography and etching follow the deposition to selectively define an opening 111 in the second passivation layer 106 over the bond pad 107. The second passivation layer 109 partially covers the bond pad 107 and leaves a surface of the bond pad 107 in the opening 111 exposed. The opening 119 has sidewalls 108. The second passivation layer 109 absorbs or releases thermal or mechanical stress caused by packaging of the substrate 101.

Figure 3:
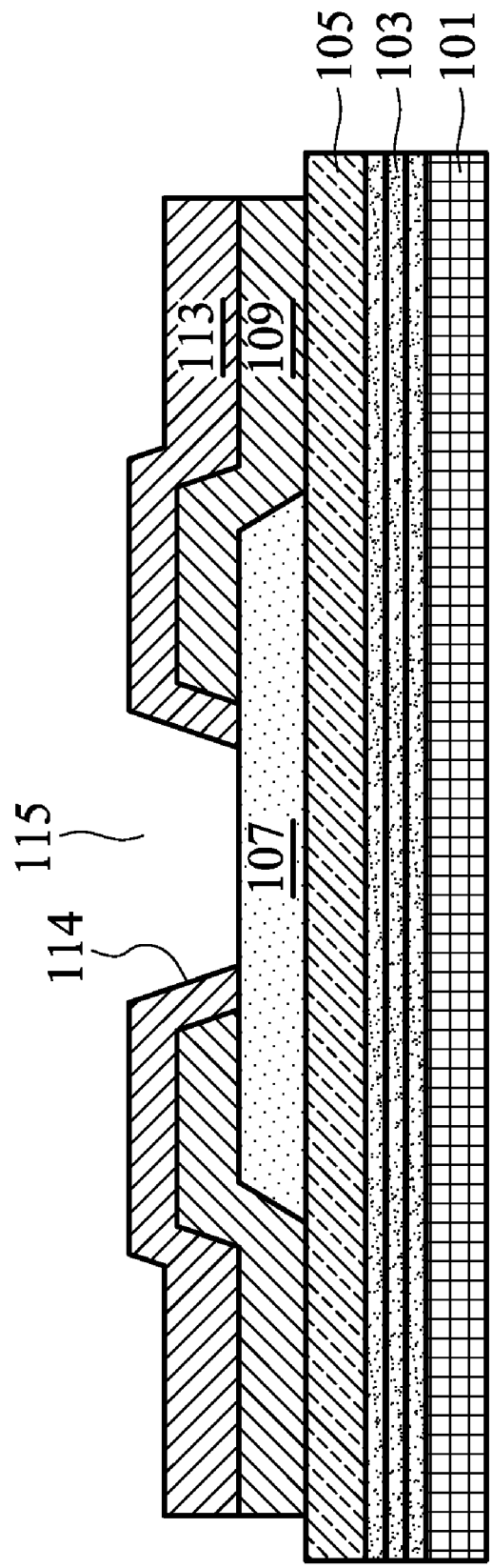

Referring to FIG. 3, a buffer layer 113 is formed over the second passivation layer 109 and the bond pad 107. The buffer layer 113 comprises polyimide, Polybenzobisoxazole (PBO) or epoxy, and has a thickness of between about 2 μm and about 10 µm. The buffer layer 113 is first deposited to cover the second passivation layer 109 and fill into the opening 111 to cover the exposed surface of the bond pad 107. Deposition of the buffer layer 113 is followed by photolithography and patterning to selectively define a combined opening 115 that exposes a portion of the bond pad 107. The combined opening 115 has sidewalls 114. The buffer layer 113 serves as a stress buffer to reduce stress transfer to the first passivation layer 105 and the second passivation layer 109 during assembly process.

Figure 4:
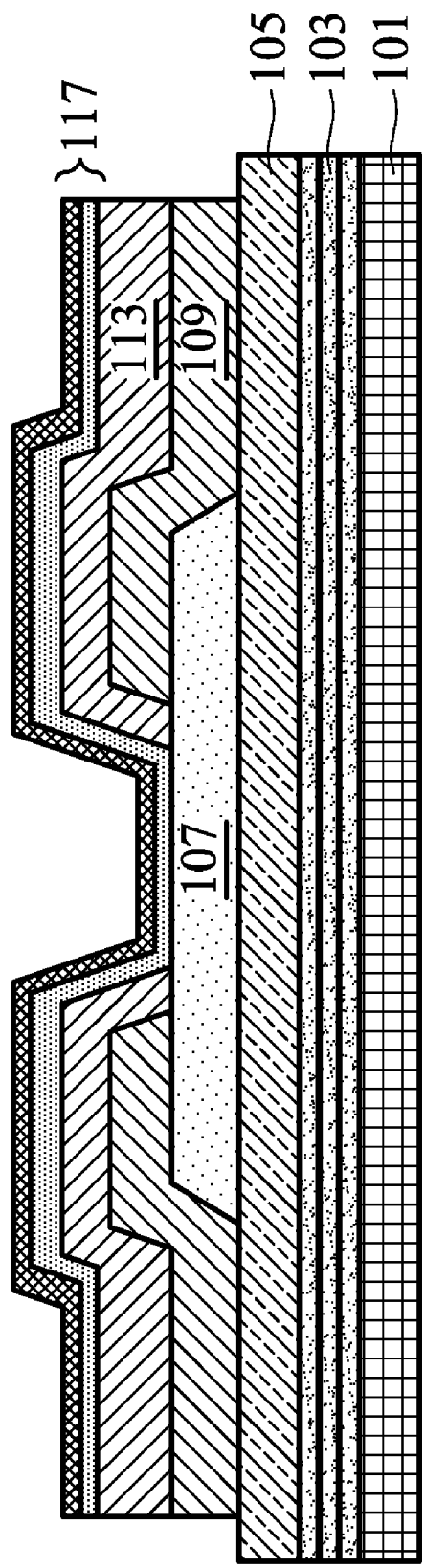

Referring to FIG. 4, an under bump metallurgy (UBM) layer 117 is formed over the buffer layer 113 and lines the sidewalls 114 of the combined opening 115 and contacts the exposed portion of the bond pad 107. In some embodiments, the UBM layer 117 may include multiple layers of conductive materials, such as a layer of titanium and a layer of copper. Each layer in the UBM layer 117 may be formed using a plating process, such as electrochemical plating, although other processes of formation, such as sputtering, evaporation, electroless plating, or plasma enhanced chemical vapor deposition (PECVD), may alternatively be used depending upon the materials used for UBM layer 117.

Figure 5:
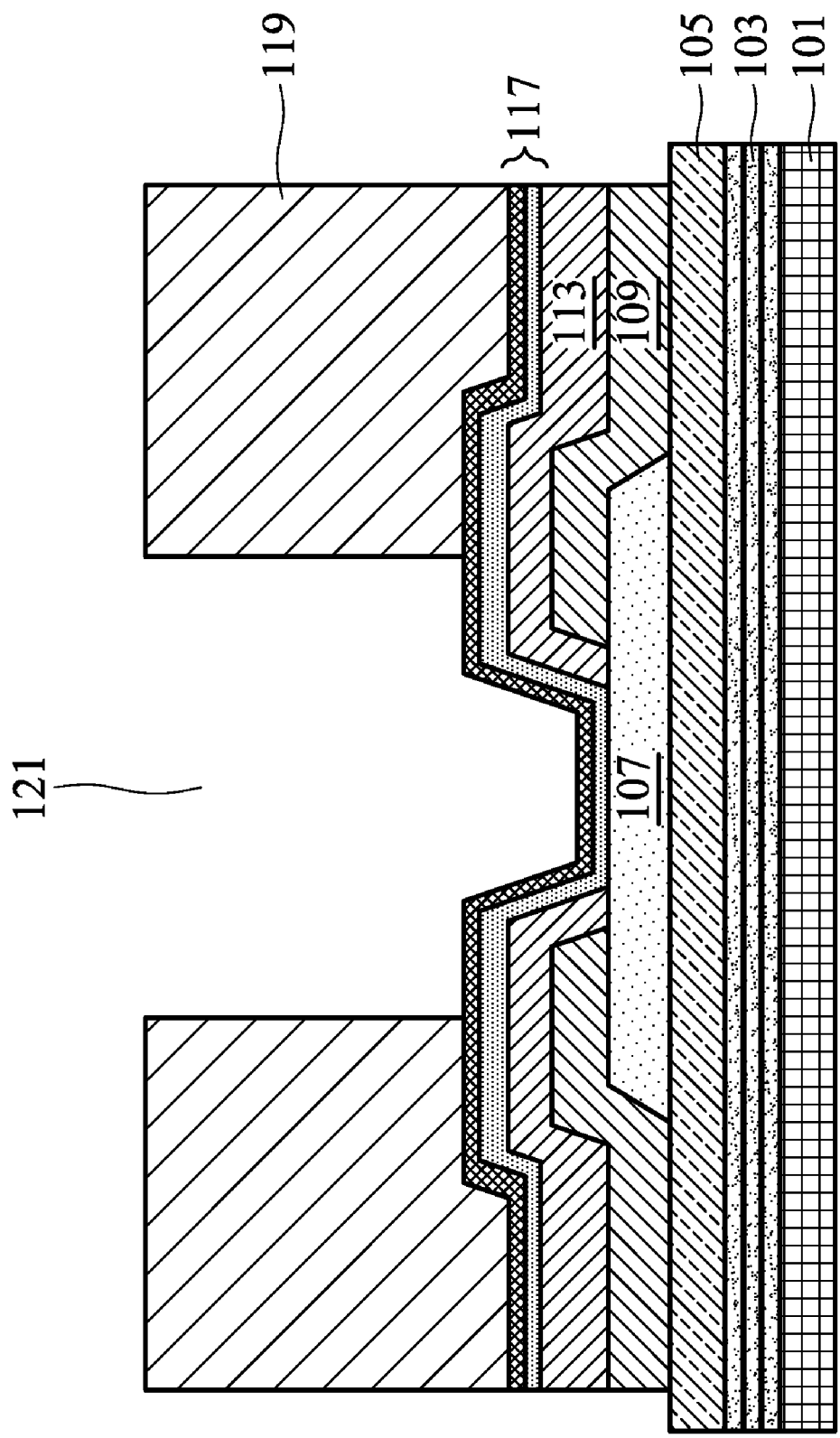

Next in FIG. 5, a photoresist layer 119 is formed over the UBM layer 117 and patterned to form a hole 121 that exposes the portion of the UBM layer 117 over the combined opening 115 and the bond pad 107. The photoresist layer acts as a mold for a metal deposition process used for conductive pillar formation. The photoresist material is one that is compatible with conventional equipment and standard ancillary process chemicals used in electroplating.

Figure 6:
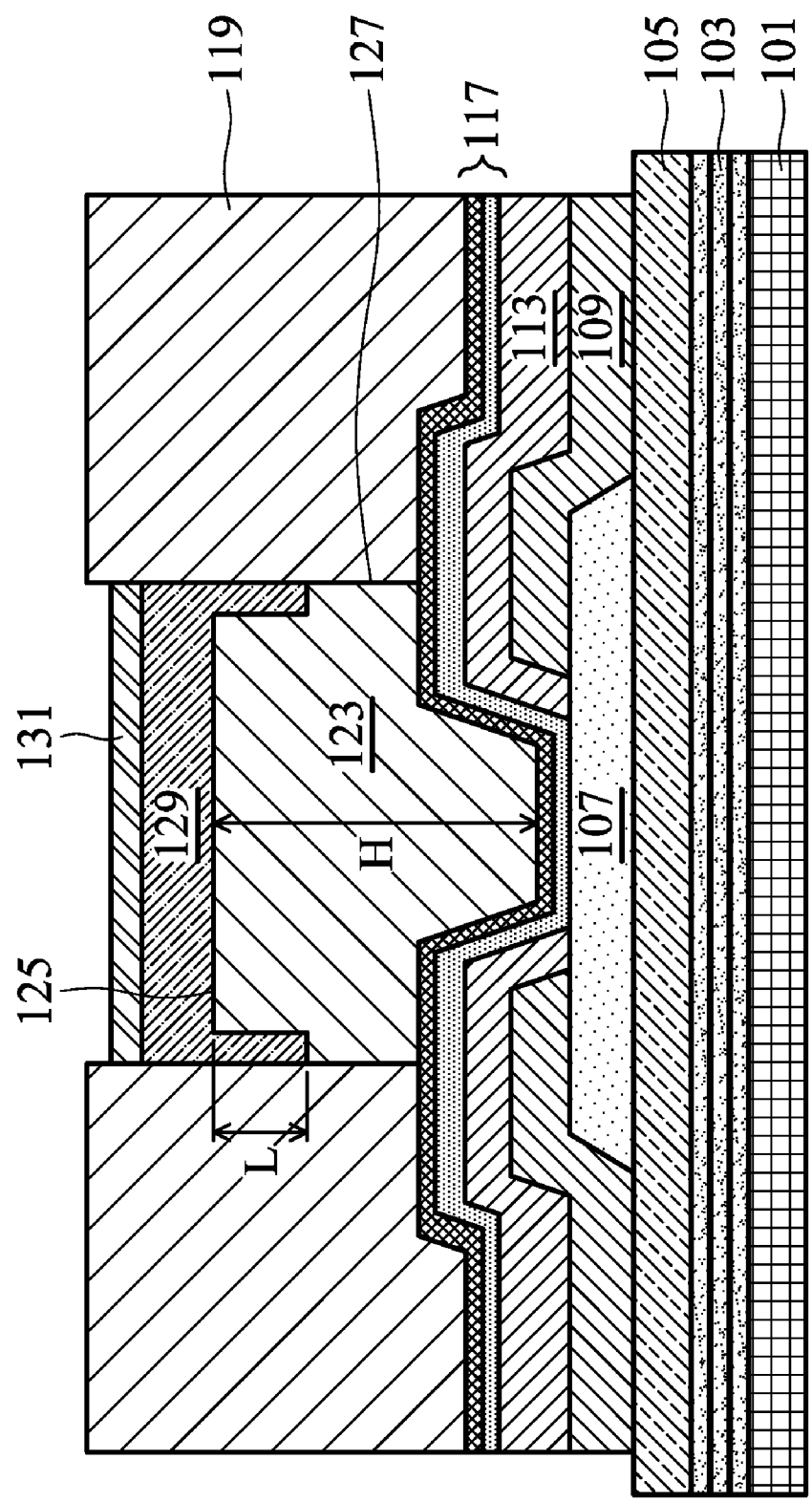

Referring to FIG. 6, a conductive material may be filled in a portion of the hole 121 by evaporation, electroplating, or screen printing to form a conductive pillar 123 over the UBM layer 117. The conductive material may be any of a variety of metals or metal alloys. For example, the conductive material may be copper, tin, silver or gold. The conductive pillar 123 comprises a top surface 125, edge sidewalls 127 and has a height H.

A cap layer 129 is formed over the top surface 125 of the conductive pillar 123 and filling a portion of the hole 121. The cap layer 129 also extends along a length L of the edge sidewalls 127 of the conductive pillar 123. In one embodiment, the cap layer 129 is formed by immersing the substrate 101 in a plating solution containing nickel. The solution may be maintained at a predetermined temperature at about 50° C. The solution may be maintained to have a predetermined concentration of $Ni(SO_3NH_2)_2$ at least higher than 330 g/liter. Nickel is deposited on the surface 125 of the conductive pillar 123 by a chemical reaction process. It is believed that the high concentration of nickel ions in the plating solution causes the solution to penetrate through the interface between the photoresist layer 119 and the conductive pillar 123 to form the cap layer 129 comprising nickel on the edge sidewalls 127 of the conductive pillar 123. In some embodiments, a ratio of the length L of the cap layer 129 to the height H of the conductive pillar 123 is between about 0.0022 to about 0.088. The cap layer 129 has a thickness of about 1000 Å to about 40000 Å. Regardless of the mechanism, the formation of the cap layer 129 may reduce stress that generates cracks along the interface of conductive pillar 123 and the solder that is used to bond the component in the following process. The stress that leads to underfill cracking along the interface of the underfill and the copper pillar may also reduce. In other embodiment, the cap layer 129 may comprises gold, tin, or silver. In some embodiments, the material of the cap layer 129 is different from the conductive material.

Still referring to FIG. 6, a solder material 131 is deposited to fill a portion of the hole 121 over a top surface of the cap layer 129. According to one embodiment, the solder material 131 is a lead-free solder material. According to some embodiments, the solder material 131 is made from a solder paste containing a low percentage of lead (Pb). The solder material 131 has a melting point lower than that of the conductive pillar 123 and the cap layer 129.

Figure 7:
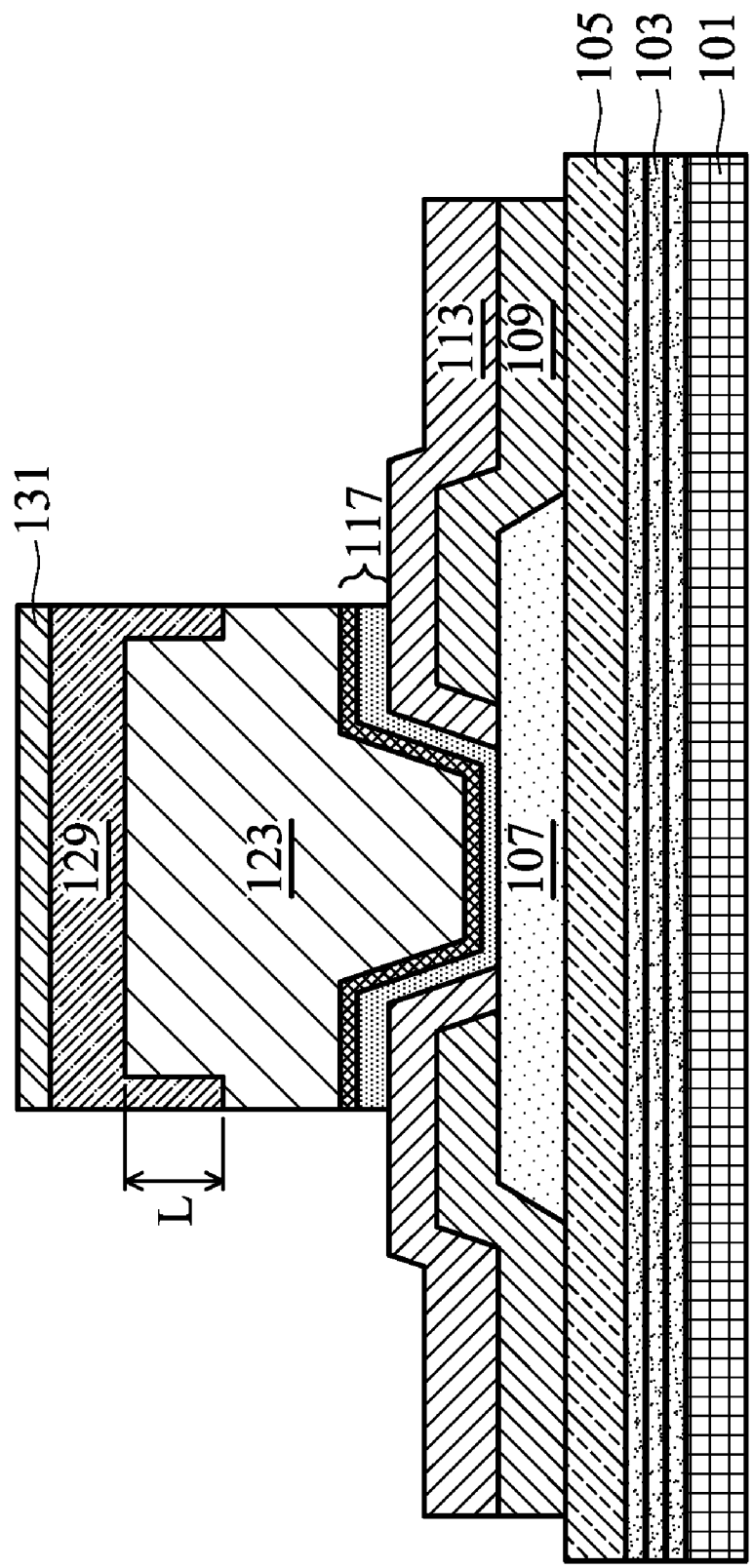

Referring to FIG. 7, the photoresit layer 119 is removed. After the removal of photoresist layer 119, the conductive pillar 123 is used as a mask to remove the UBM layer 117 not covered by the conductive pillar 123. An etching process is performed to etch the exposed portions of the UBM layer 117 down to expose the underlying buffer layer 113. The remaining UBM layer 117 under the conductive pillar 123 is disposed over the sidewalls 114 of the combined opening 115, and is also over a top portion of the buffer layer 117, and contacts the exposed portion of the bond pad 107.

Figure 8:
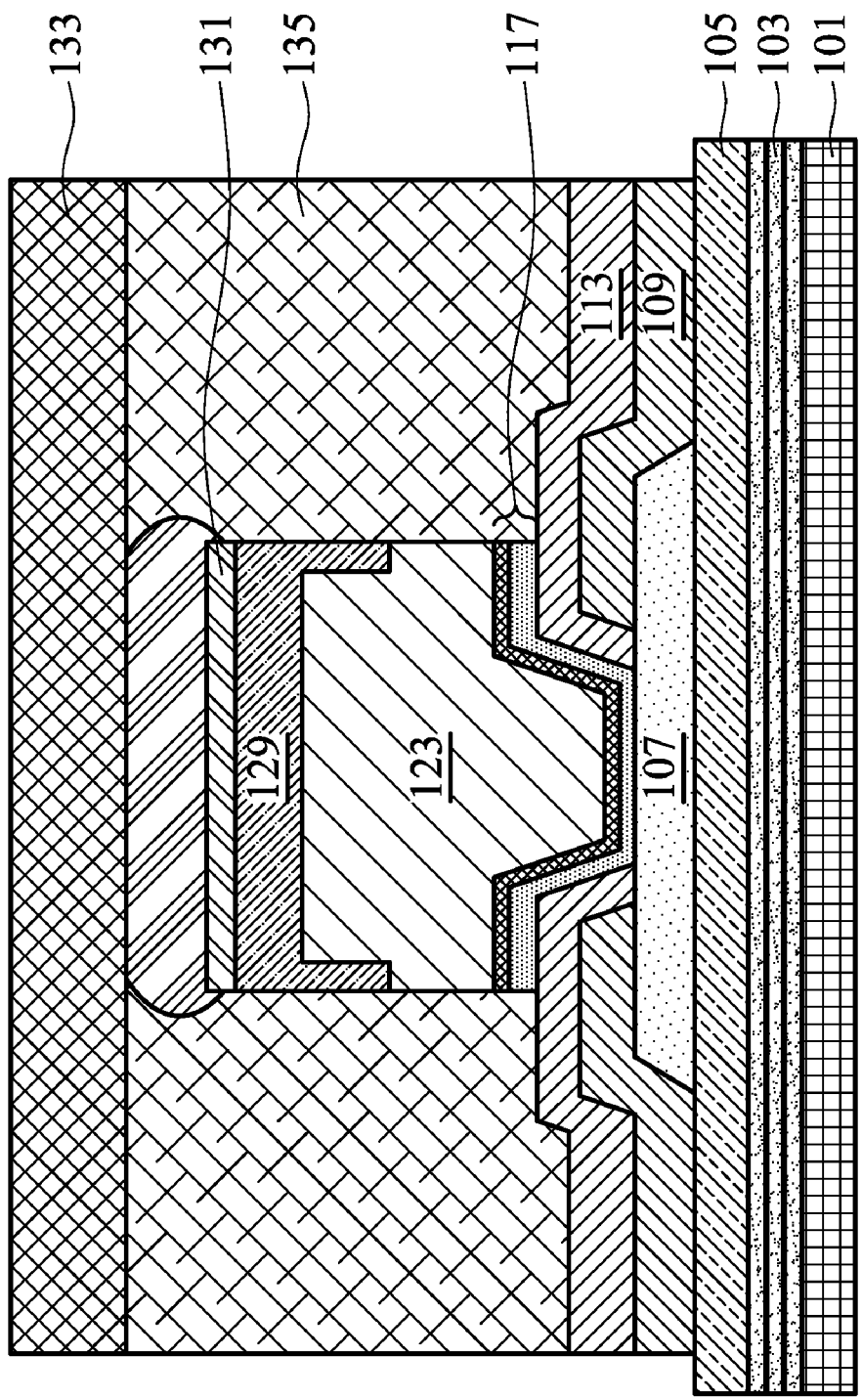

FIG. 8 illustrates a cross-sectional view of an electrical component according to an embodiment. The substrate 101 is bonded to a component 133 using the conductive pillar 123 as shown in FIG. 7. For the sake of simplicity and brevity, the component 133 is shown as a simple chip without further details. In one embodiment, the component 133 may include semiconductor chip, package substrate, circuit board or any suitable component being familiar to those skilled in the art. The substrate 101 and the component 133 could be electrically connected through the conductive pillar 123. The bonding methods comprise copper-to-copper bonding, solder bonding or any suitable method being familiar to those skilled in the art.

After the bonding process, a gap is defined between the substrate 101 and the electrical component 133. An underfill 135 may be filled in this gap to protect the conductive pillar 123 and increase the reliability of the package. The underfill 135 reduces stress between the conductive pillar 123, the substrate 101 and the component 133, and spreads the heat uniformly within this stacked electrical component. The underfill 135 may include, but is not limited to, epoxies, polyimides or other thermoplastic or thermoset materials or any suitable material being familiar to those skilled in the art.

Various embodiments of the present invention may be used to moderate the shortcomings of the conventional solder bump manufacturing process. For example, in the various embodiments the cap layer 129 protects the top corner of the conductive pillar 123 that may reduce stress that generates cracks along the interface of conductive pillar 123 and the solder that is used to bond the component in the following process. The formation of the cap layer 129 will improve the yield of assembly.

Although the embodiments and its advantages have been described in detail, it should be understood that various changes, substitutions or alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor die comprising:
   a substrate;
   a bond pad over the substrate;
   an under bump metallurgy (UBM) layer over and contacting the bond pad;
   a conductive pillar over the UBM layer, the conductive pillar having a top surface, edge sidewalls and a height, and lower portions of the edge sidewalls of the conductive pillar aligned with sidewalls of the UBM layer;
   a cap layer over the top surface of the conductive pillar that extends along the edge sidewalls of the conductive pillar for a length; and
   a solder material over a top surface of the cap layer,
   wherein a ratio of the length to the height is between about 0.0022 to about 0.088.

2. The semiconductor die of claim 1, wherein the conductive pillar comprises copper, gold, tin, or silver.

3. The semiconductor die of claim 1, wherein the cap layer comprises nickel, gold, tin, or silver.

4. The semiconductor die of claim 1, wherein the cap layer has a thickness of about 1000 Å to about 4000 Å.

5. The semiconductor die of claim 1, further comprising a package substrate bonded to the solder material.

6. The semiconductor die of claim 1, wherein the conductive pillar comprises copper and the cap layer comprises nickel.

7. A semiconductor die comprising:
   a substrate;
   a bond pad over the substrate;
   a protection layer over the bond pad and the substrate, the protection layer having a first opening;
   a buffer layer over the protection layer, the buffer layer having a second opening, wherein the first opening and the second opening form a combined opening having sidewalls and exposing a portion of the bond pad;
   a UBM layer lining the sidewalls of the combined opening, overlying a top portion of the buffer layer, and contacting the exposed portion of the bond pad;
   a conductive pillar overlying the UBM layer, the conductive pillar having a top surface, edge sidewalls and a height, and lower portions of the edge sidewalls of the conductive pillar aligned with sidewalls of the UBM layer;
   a cap layer over the top surface of the conductive pillar that extends over along the edge sidewalls of the conductive pillar for a length; and
   a solder material over a top surface of the cap layer.

8. The semiconductor die of claim 7, wherein a ratio of the length to the height is between about 0.0022 to about 0.088.

9. The semiconductor die of claim 7, wherein the conductive pillar comprises copper, gold, tin, or silver.

10. The semiconductor die of claim 7, wherein the cap layer comprises nickel, gold, tin, or silver.

11. The semiconductor die of claim 7, wherein the cap layer has a thickness of about 1000 Å to about 40000 Å.

12. A semiconductor structure comprising:
    a substrate;
    a conductive pillar over the substrate and having a height, the conductive pillar including:
      a lower portion having lower sidewalls; and
      an upper portion over the lower portion, the upper portion having a top surface and upper sidewalls, a width of the upper portion being less than that of the lower portion;
    a cap layer over the top surface of the upper portion and extending along the upper sidewalls; and
    a solder material over a top surface of the cap layer.

13. The semiconductor structure of claim 12, wherein the cap layer extends along the upper sidewalls for a predetermined length.

14. The semiconductor structure of claim 13, wherein a ratio of the predetermined length to the height ranges from about 0.0022 to about 0.088.

15. The semiconductor structure of claim 12, wherein the cap layer having sidewalls levels with the lower sidewalls of the lower portion.

16. The semiconductor structure of claim 12, wherein the conductive pillar comprises copper, gold, tin, or silver.

17. The semiconductor structure of claim 12, wherein the cap layer comprises nickel, gold, tin, or silver.

18. The semiconductor structure of claim 12, wherein the cap layer has a thickness ranging from about 1000 Å to about 4000 Å.

19. The semiconductor structure of claim 12, further comprising an under bump metallurgy (UBM) structure between the substrate and the conductive pillar.

20. The semiconductor die of claim 1, wherein the height of the conductive pillar is measurable from a top surface of the UBM layer to the top surface of the conductive pillar.

* * * * *